US012781729B2

(12) United States Patent
Son et al.

(10) Patent No.: US 12,781,729 B2
(45) Date of Patent: Nov. 3, 2026

(54) TORSION PUMP, CHEMICAL LIQUID SUPPLYING APPARATUS, AND SUBSTRATE TREATING APPARATUS

(71) Applicant: SEMES CO., LTD., Chungcheongnam-do (KR)

(72) Inventors: Young Jun Son, Chungcheongnam-do (KR); Byoung Doo Choi, Chungcheongnam-do (KR); Woo Sin Jung, Chungcheongnam-do (KR); Sung Chul Jung, Chungcheongnam-do (KR); Woo Ram Lee, Seoul (KR); Ki Sang Eum, Chungcheongnam-do (KR); Young Un Yun, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 753 days.

(21) Appl. No.: 17/896,518

(22) Filed: Aug. 26, 2022

(65) Prior Publication Data

US 2023/0060309 A1 Mar. 2, 2023

(30) Foreign Application Priority Data

Aug. 31, 2021 (KR) ........................ 10-2021-0115646

(51) Int. Cl.
*F04B 43/08* (2006.01)
*G03F 7/16* (2006.01)

(52) U.S. Cl.
CPC .............. *F04B 43/084* (2013.01); *G03F 7/16* (2013.01)

(58) Field of Classification Search
CPC ................................ F04B 43/084; G03F 7/16
See application file for complete search history.

(56) References Cited

U.S. PATENT DOCUMENTS

2002/0194933 A1* 12/2002 Roelofs ................ F04B 43/084 73/861.49
2020/0290080 A1* 9/2020 Naitou ............... B05C 11/1005

FOREIGN PATENT DOCUMENTS

| | | | | | |
|---|---|---|---|---|---|
| JP | H04-083994 | A | | 3/1992 | |
| JP | 2001-82343 | A | | 3/2001 | |
| JP | 2002070748 | A | * | 3/2002 | |
| JP | 2004-156582 | A | | 6/2004 | |
| JP | 2012-189086 | A | | 10/2012 | |
| KR | 100751657 | B1 | * | 8/2007 | ............. F04B 13/10 |
| KR | 10-0910703 | B1 | | 8/2009 | |
| KR | 10-1193703 | B1 | | 10/2012 | |

(Continued)

OTHER PUBLICATIONS

JP-2002070748-A Translation (Year: 2002).*

(Continued)

*Primary Examiner* — Dah-Wei D. Yuan
*Assistant Examiner* — Stephen A Kitt
(74) *Attorney, Agent, or Firm* — Carter, DeLuca & Farrell LLP

(57) ABSTRACT

Provided is a pump for supplying a liquid, the pump including: a flexible tube body including a pump chamber; first flange provided at one end of the tube body and including an inlet communicating with the pump chamber; a second flange provided at the other end of the tube body and including an outlet communicating with the pump chamber; and driving unit for transmitting rotational force to the tube body to twist the tube body.

20 Claims, 19 Drawing Sheets

(56) References Cited

FOREIGN PATENT DOCUMENTS

| | | | |
|---|---|---|---|
| KR | 10-1281210 | B1 | 7/2013 |
| KR | 10-1967217 | B1 | 4/2019 |
| KR | 10-2019-0095878 | A | 8/2019 |
| KR | 10-2020-0039068 | A | 4/2020 |
| WO | 2007/067339 | A2 | 6/2007 |

OTHER PUBLICATIONS

KR-100751657-B1 Translation (Year: 2007).*

Notice of Reasons for Refusal issued by the Japanese Patent Office on Aug. 29, 2023 in corresponding JP Patent Application No. 2022-136266, with English translation.

"Product Note, PN 413 Regulator Outlet Pressure Overshoot Upon Initial Pressurization" APTech Advanced Pressure Technology (Jun. 2007) pp. 1-3.

Korean Office Action issued in corresponding KR Patent Application No. 10-2021-0115646, dated Apr. 25, 2023, together with English translation.

* cited by examiner

TORSION PUMP, CHEMICAL LIQUID SUPPLYING APPARATUS, AND SUBSTRATE TREATING APPARATUS

CROSS-REFERENCE TO RELATED APPLICATIONS

This application claims priority to and the benefit of Korean Patent Application No. 10-2021-0115646 filed in the Korean Intellectual Property Office on Aug. 31, 2021, the entire contents of which are incorporated herein by reference.

TECHNICAL FIELD

The present invention relates to a pump and a chemical liquid supplying apparatus including the same.

BACKGROUND ART

In order to manufacture a semiconductor device or a liquid crystal display, various processes, such as photography, etching, ashing, ion implantation, thin film deposition, and cleaning, are performed on a substrate. Among them, in the photography, etching, ashing, and cleaning processes, a liquid treating process supplying a liquid onto the substrate is performed.

In general, the liquid treating process is a process for liquid-processing the substrate by discharging a processing liquid from a nozzle.

Various pumps are used for the chemical liquid supplying apparatus of the liquid treatment process. Among them, the mini pump (Entegris, rolling diaphragm method) is difficult to be applied to micro process equipment (ArF, EUV equipment) because of its poor chemical liquid replacement rate and high possibility of causing particles by the stagnant photoresist (PR).

Another EPT pump (Korea Institute of Industrial Technology, jointly developed with Koganei, tube diaphragm method) requires a ball screw, LM guide, LM block, and the like for converting the rotational force of the motor into up-and-down moving force, which increases the size of the pump.

SUMMARY OF THE INVENTION

The present invention has been made in an effort to provide a torsion pump, a chemical liquid supplying unit, and a substrate treating apparatus, which are capable of improving a chemical liquid replacement rate.

The present invention has also been made in an effort to provide a torsion pump, a chemical liquid supplying unit, and a substrate treating apparatus, which have a decreased size.

The problem to be solved by the present invention is not limited to the above-mentioned problems. The problems not mentioned will be clearly understood by those skilled in the art from the descriptions below.

An exemplary embodiment of the present invention provides a torsion pump, including: a tube including a pump chamber communicating with a chemical liquid inlet and a chemical liquid outlet; and a driving unit for transmitting rotational force to the tube to twist the tube.

Further, the tube may include: a flexible tube body; a first flange provided at one end of the tube body; and a second flange provided at the other end of the tube body, and the second flange is connected to the driving unit and rotates.

Further, the first flange may be provided with the chemical liquid inlet, and the second flange may be provided with the chemical liquid outlet.

Further, the torsion pump may further include a sealing case provided to surround the tube.

Further, the sealing case may be provided in a cylindrical shape.

Further, the sealing case may be filled with an incompressible fluid therein.

Further, an offset space may be provided between the sealing case and the tube to limit twist of the tube.

Further, the torsion pump may further include a rotating member which is installed on the tube body and transmits the rotational force of the driving unit to the tube.

The rotating member may be installed in the middle of the tube body.

Further, the tube body may have a multi-leaf shape in cross section.

Further, the tube body may have a helically twisted structure around a core.

Further, a cross-sectional shape of an upper end of the tube body may be different from a cross-sectional shape of a lower end of the tube body.

Another exemplary embodiment of the present invention provides a chemical liquid supplying apparatus, including: a pump for supplying a chemical liquid to a nozzle discharging the chemical liquid to a substrate; a trap tank in which the chemical liquid to be supplied from the pump to the nozzle is temporarily stored; a bottle containing the chemical liquid stored in the trap tank; and a filter provided on a path through which the chemical liquid is supplied from the trap tank to the pump, in which the pump includes: a tube including a pump chamber communicating with a chemical liquid inlet and a chemical liquid outlet; and a driving unit for transmitting rotational force to the tube to twist the tube.

Further, the tube may include: a flexible tube body; a first flange provided at one end of the tube body and including the chemical liquid inlet; and a second flange provided at the other end of the tube body and including the chemical liquid outlet, and the second flange may receive rotational force from the driving unit.

Further, the chemical liquid supplying apparatus may further include a sealing case provided to surround the tube, in which the sealing case may be filled with an incompressible fluid therein.

Further, an offset space may be provided between the sealing case and the tube to limit twist of the tube.

Further, the chemical liquid supplying apparatus may further include a rotating member which is installed on the tube body and transmits the rotational force of the driving unit to the tube, in which the rotating member may be installed in the middle of the tube body.

Further, the tube body may have a multi-leaf shape in cross section.

Further, the tube body may have a helically twisted structure around a core.

Further, a cross-sectional shape of an upper end of the tube body may be different from a cross-sectional shape of a lower end of the tube body.

Still another exemplary embodiment of the present invention provides a torsion pump, including: a flexible tube body including a pump chamber; a first flange provided at one end of the tube body and including an inlet communicating with the pump chamber; a second flange provided at the other end of the tube body and including an outlet communicating with the pump chamber; and a driving unit for transmitting rotational force to the tube body to twist the tube body.

Further, the torsion pump may further include a sealing case provided to surround the tube, in which a space between the sealing case and the tube may be filled with an incompressible fluid.

Further, an offset space may be provided between the sealing case and the tube to limit twist of the tube.

Further, the tube body may have a multi-leaf shape in cross section, and have a helically twisted structure around a core.

According to the exemplary embodiment of the present invention, it is possible to substitute a chemical liquid replacement ratio.

According to the exemplary embodiment of the present invention, it is possible to decrease a size of the pump.

DETAILED DESCRIPTION

Advantages and characteristics, and a method for achieving them will be clear when exemplary embodiments described in detail with reference to the accompanying drawings are referred to. However, the present disclosure is not limited to exemplary embodiments disclosed herein but will be implemented in various forms, and the exemplary embodiments are provided so that the present disclosure is completely disclosed, and a person of ordinary skilled in the art can fully understand the scope of the present disclosure, and the present disclosure will be defined only by the scope of the appended claims.

Even if not defined, all terms (including technical or scientific terms) used herein have the same meaning as commonly accepted by common skill in the related art to which this invention belongs. Terms defined by the general dictionaries may be interpreted as having the same meaning as in the related art and/or in the text of the present application, and the terms will not be conceptualized or interpreted overly formal even if the term is not a clearly defined expression here. The terms used in the present specification is for the purpose of describing exemplary embodiments, and do not intend to limit the present invention.

In the present specification, a singular form includes a plural form as well, unless otherwise mentioned. A term "include" and/or various conjugations of this verb do not exclude the existence or an addition of one or more other compositions, components, constituent elements, steps, operations, and/or devices, in addition to the mentioned composition, component, constituent element, step, operation, and/or device. Further, "is provided", "have", and the like should be interpreted in the same way.

The equipment of the present exemplary embodiment is described as being used to perform a photolithography process on a substrate, such as a semiconductor wafer or a flat panel display panel, but this is for convenience of description and the present invention may also be used for other apparatuses using a pump for supplying a chemical liquid to treat a substrate.

Hereinafter, an exemplary embodiment of the present invention will be described with reference to FIGS. 1 to 22.

Figure 1:
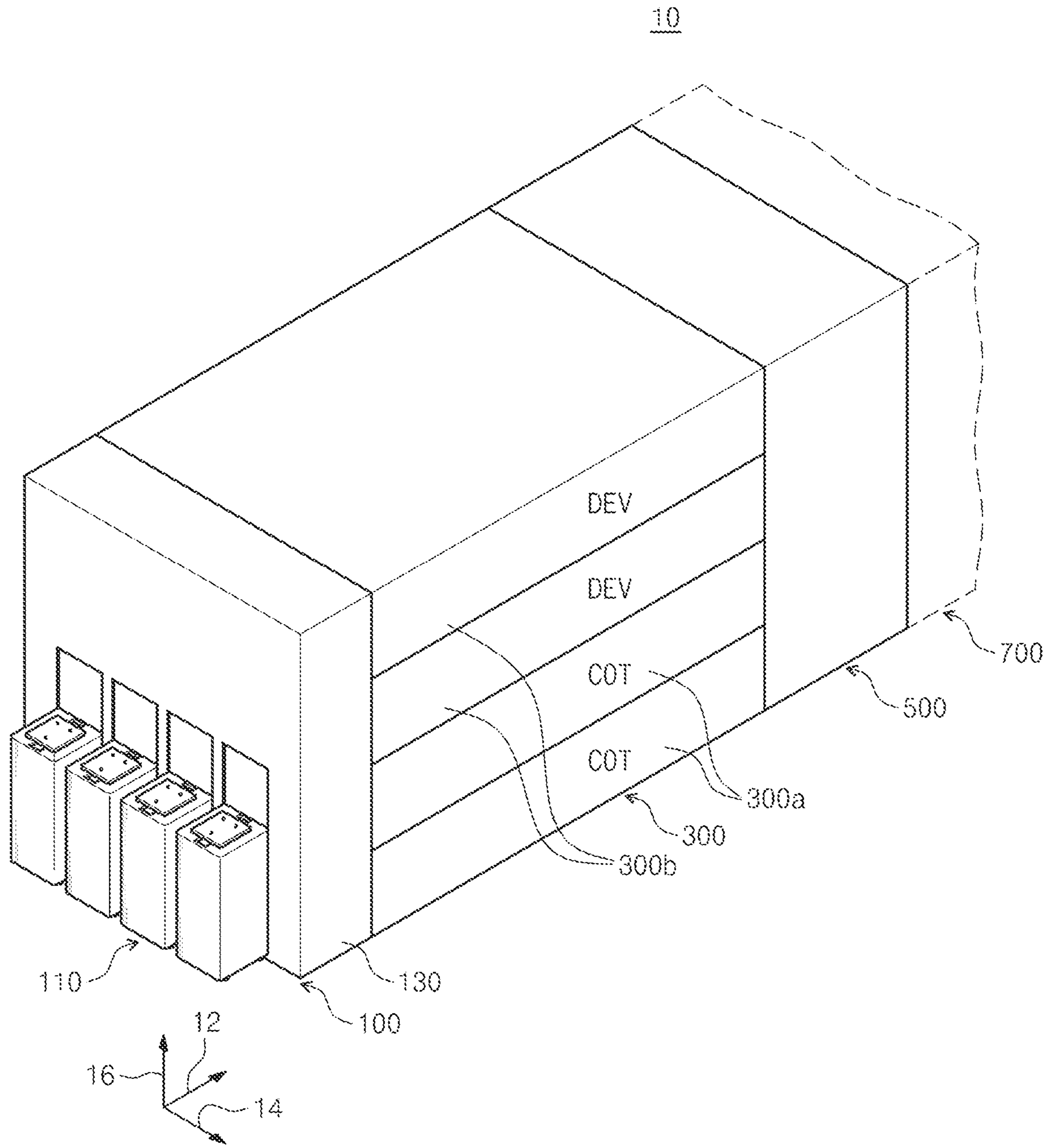
FIG. 1 is a perspective view schematically illustrating a substrate treating apparatus according to an exemplary embodiment of the present invention.
Figure 2:
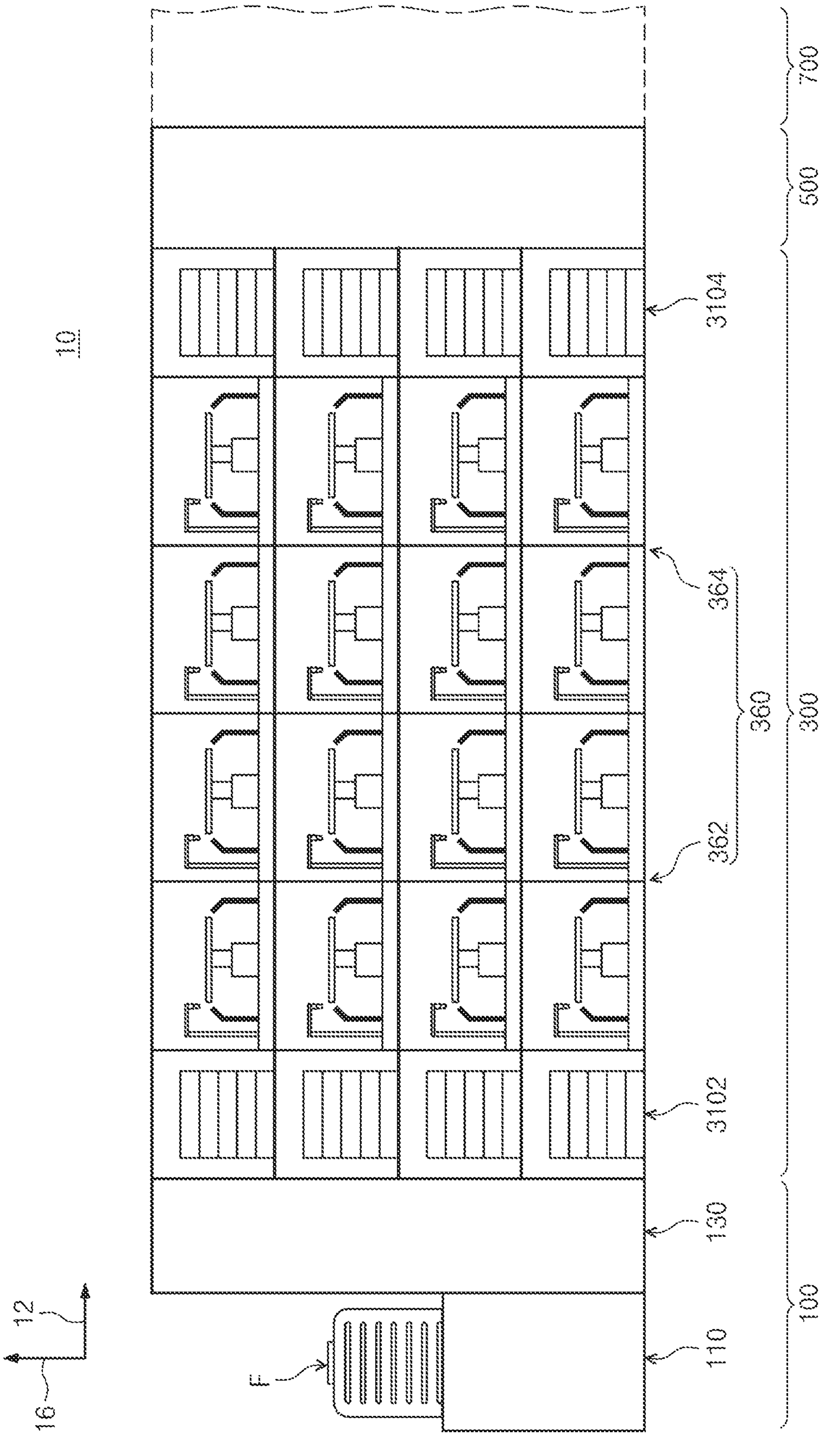
FIG. 2 is a cross-sectional view of the substrate treating apparatus illustrating a coating block or a developing block of FIG. 1.
Figure 3:
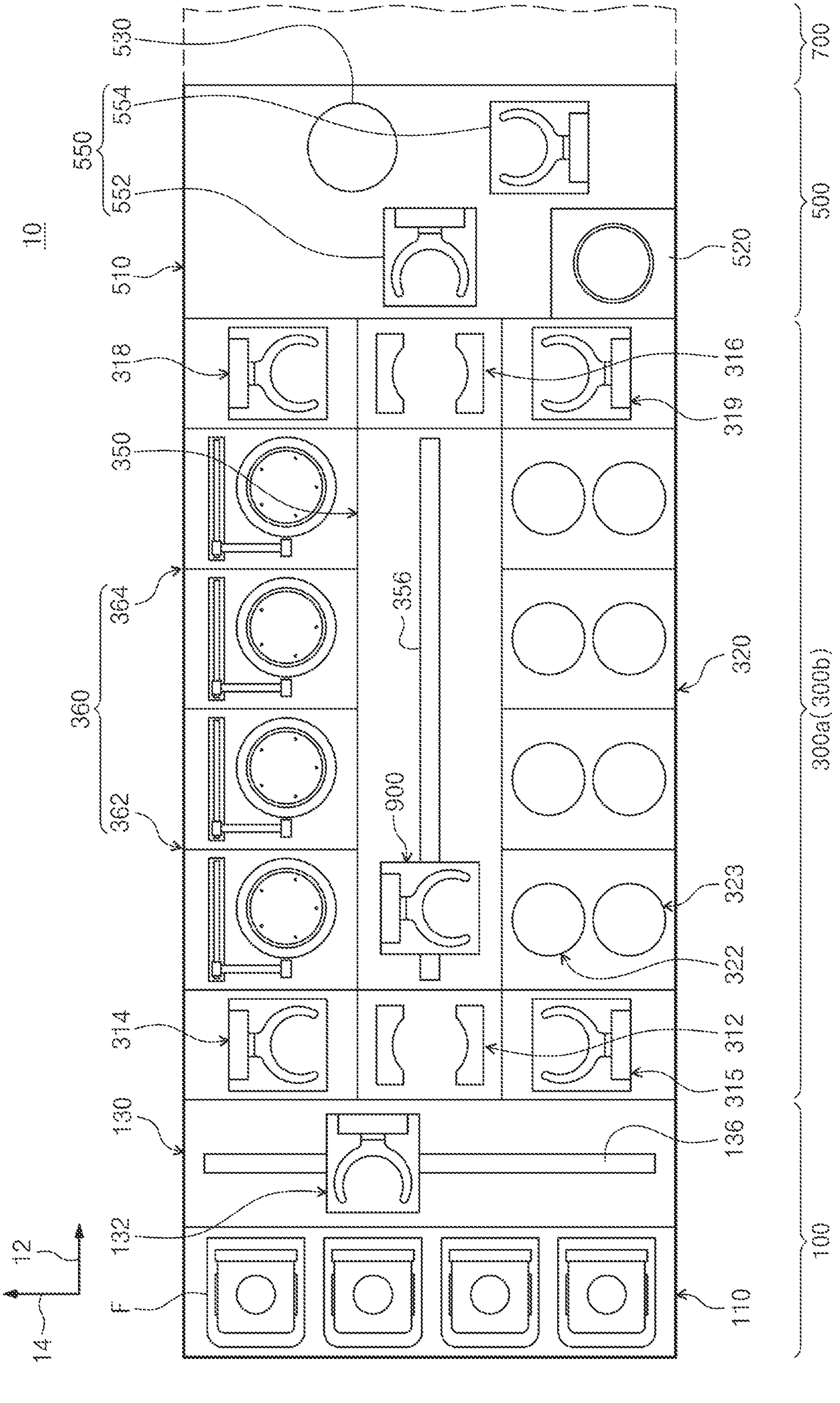
FIG. 3 is a top plan view of the substrate treating apparatus of FIG. 1.

FIG. 1 is a perspective view schematically illustrating a substrate treating apparatus according to an exemplary embodiment of the present invention, FIG. 2 is a cross-sectional view of the substrate treating apparatus illustrating a coating block or a developing block of FIG. 1, and FIG. 3 is a top plan view of the substrate treating apparatus of FIG. 1.

Referring to FIGS. 1 to 3, a substrate treating apparatus 10 according to the exemplary embodiment of the present invention includes an index module 100, a processing module 300, and an interface module 500.

According to the exemplary embodiment, the index module 100, the processing module 300, and the interface module 500 are sequentially arranged in a line. Hereinafter, the direction in which the index module 100, the processing module 300, and the interface module 500 are arranged is called a first direction 12, and when viewed from the top, a direction perpendicular to the first direction 12 is defined as a second direction 14, and a direction perpendicular to both the first direction 12 and the second direction 14 is defined as a third direction 16.

The index module 100 transfers a substrate W to the processing module 300 from a container F in which the substrate W is accommodated, and receives the completely treated substrate W into the container F. A longitudinal direction of the index module 100 is provided in the second direction 14. The index module 100 includes a load port 110 and an index frame 130. With respect to the index frame 130, the load port 110 is located on the opposite side of the processing module 300. The container F in which the substrates W are accommodated is placed on the load port 110. A plurality of load ports 110 may be provided, and the plurality of load ports 110 may be disposed along the second direction 14.

As the container F, an airtight container F, such as a Front Open Unified Pod (FOUP), may be used. The container F may be placed on the load port 110 by a transfer means (not illustrated), such as an overhead transfer, an overhead conveyor, or an automatic guided vehicle, or an operator.

An index robot 132 is provided inside the index frame 130. A guide rail 136 of which a longitudinal direction is provided in the second direction 14 is provided within the index frame 130, and the index robot 132 may be provided to be movable on the guide rail 136. The index robot 132 includes a hand on which the substrate W is placed, and the hand is provided to be movable forward and backward, rotatable about the third direction 16, and movable in the third direction 16.

The processing module 300 may perform a coating process and a developing process on the substrate W. The processing module 300 may receive the substrate W accommodated in the container F and perform a substrate treating process. The processing module 300 includes an applying block **300*a* and a developing block 300*b*. The costing block 300*a* performs an application process on the substrate W, and the developing block 300*b* performs a developing process on the substrate W. A plurality of coating blocks 300*a* is provided, and the coating blocks 300*a* are provided to be stacked on each other. A plurality of developing blocks 300*b* is provided, and the developing blocks 300*b* are provided to be stacked on each other. According to the exemplary embodiment of FIG. 1, two coating blocks 300*a* and two developing blocks 300*b* are provided respectively. The coating blocks 300*a* may be disposed under the developing blocks 300*b*. According to an example, the two coating blocks 300*a* perform the same process, and may be provided in the same structure. Further, the two developing blocks 300*b*** may perform the same process and may be provided in the same structure.

Referring to FIG. 3, the coating block **300*a* includes a heat treating chamber 320, a transfer chamber 350, a liquid processing chamber 360, and buffer chambers 312 and 316. The heat treating chamber 320 performs a heat treatment process on the substrate W. The heat treatment process may include a cooling process and a heating process. The liquid processing chamber 360 supplies a liquid onto the substrate W to form a liquid film. The liquid film may be a photoresist film or an antireflection film. The transfer chamber 350 transfers the substrate W between the heat treating chamber 320 and the liquid processing chamber 360 in the coating block 300*a***.

The transfer chamber 350 is provided so that a longitudinal direction thereof is parallel to the first direction 12. The transfer robot 350 is provided to the transfer chamber 900. The transfer robot 352 transfers the substrate between the heat processing chamber 320, the liquid processing chamber 360, and the buffer chambers 312 and 316. According to an example, the transfer robot 900 includes a hand on which the substrate W is placed, and the hand may be provided to be movable forward and backward, rotatable about the third direction 16, and movable in the third direction 16. A guide rail 356, of which a longitudinal direction is parallel to the first direction 12, is provided within the transfer chamber 350, and the transfer robot 900 may be provided to be movable on the guide rail 356.

Figure 4:
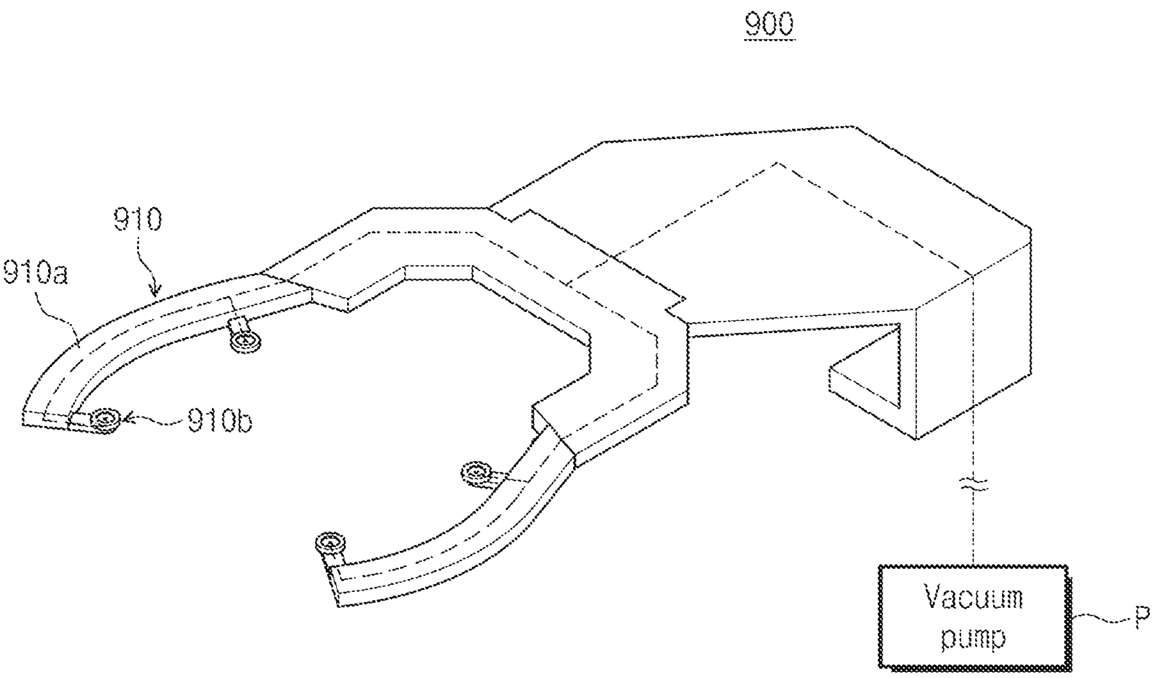
FIG. 4 is a diagram illustrating an example of a hand of a transfer robot.

FIG. 4 is a diagram illustrating an example of a hand of the transfer robot.

Referring to FIG. 4, a hand 910 includes a hand main body **910*a* and support fingers 910*b*. The hand main body 910*a* is formed in a substantially horseshoe shape having an inner diameter greater than the diameter of the substrate. However, the shape of the hand main body 910*a* is not limited thereto. In four places including the leading end of the hand main body 910*a*, the support fingers 910*b* are installed inwardly. The hand main body 910*a*** has a vacuum flow path (not illustrated) formed therein. A vacuum flow path (not illustrated) is connected to a vacuum pump through a vacuum line.

Referring back to FIGS. 1 to 3, a plurality of heat treating chambers 320 is provided. The heat treating chambers 320 are disposed along the first direction 12. The heat treating chambers 320 are located at one side of the transfer chamber 350.

Figure 5:
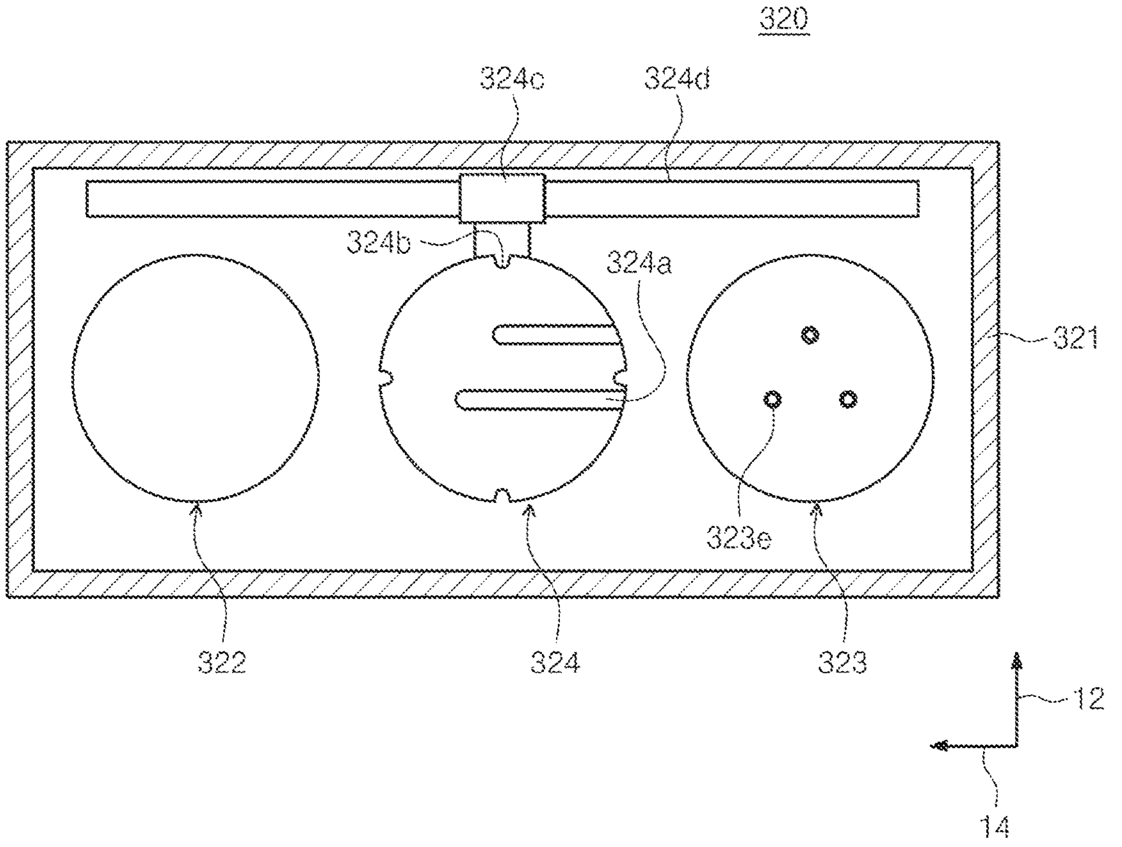
FIG. 5 is a top plan view schematically illustrating an example of a heat treating chamber of FIG. 3.
Figure 6:
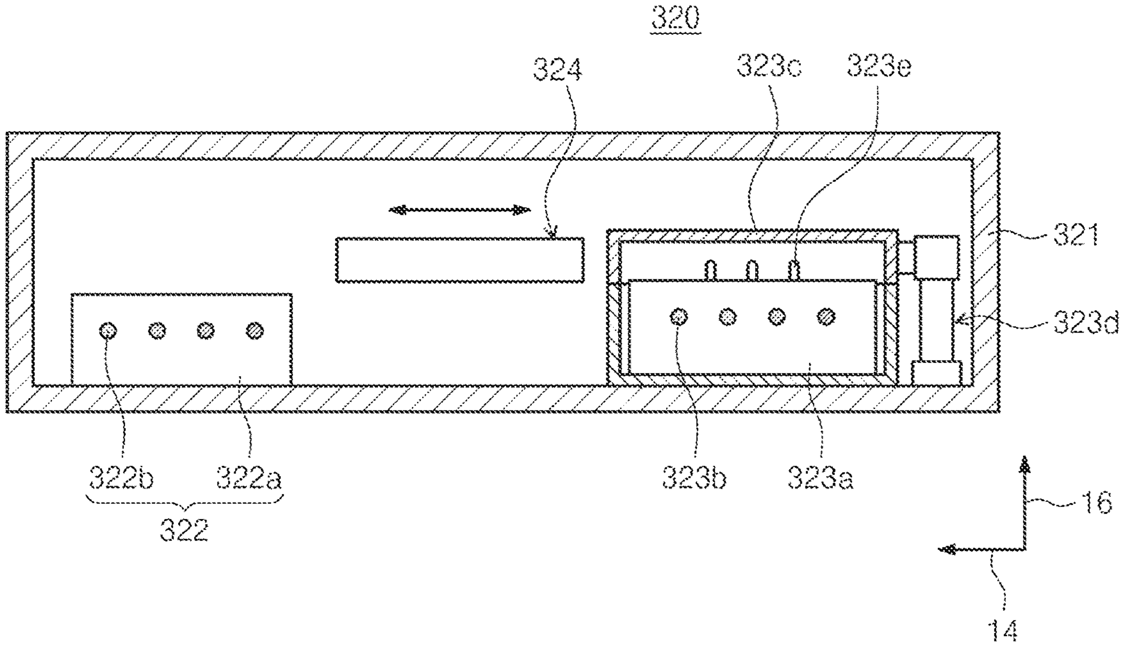
FIG. 6 is a front view of the heat treating chamber of FIG. 5.

FIG. 5 is a top plan view schematically illustrating an example of the heat treating chamber of FIG. 3, and FIG. 6 is a front view of the heat treating chamber of FIG. 5.

Referring to FIGS. 5 and 6, the heat treating chamber 320 includes a housing 321, a cooling unit 322, a heating unit 323, and a transfer plate 324.

The housing 321 is provided in the shape of a generally rectangular parallelepiped. An entrance (not illustrated) through which the substrate W enters and exits is formed on the sidewall of the housing 321. The entrance may remain open. Optionally, a door (not illustrated) may be provided to open and close the entrance. The cooling unit 322, the heating unit 323, and the transfer plate 324 are provided inside the housing 321. The cooling unit 322 and the heating unit 323 are arranged along the second direction 14. According to an example, the cooling unit 322 may be located closer to the transfer chamber 350 than the heating unit 322.

The cooling unit 322 has a cooling plate **322*a*. The cooling plate 322*a* may have a generally circular shape when viewed from the top. The cooling plate 322*a* is provided with a cooling member 322*b*. According to an example, the cooling member 322*b* is formed inside the cooling plate 322*a*** and may be provided as a flow path through which the cooling fluid flows.

The heating unit 323 includes a heating plate **323*a*, a cover 323*c*, and a heater 323*b*. The heating plate 323*a* has a generally circular shape when viewed from the top. The heating plate 323*a* has a larger diameter than the substrate W. The heater 323*b* is installed on the heating plate 323*a*. The heater 323*b* may be provided as a heating resistor to which current is applied. The heating plate 323*a* is provided with lift pins 323*e* drivable in the vertical direction along the third direction 16. The lift pin 323*e* receives the substrate W from a transfer means outside the heating unit 323 and places the received substrate W on the heating plate 323*a* or lifts the substrate W from the heating plate 323*a* and hands over the substrate W to the external transfer means. According to the example, three lift pins 323*e* may be provided. The cover 323*c*** has a space with an open lower portion therein.

The cover **323*c* is located above the heating plate 323*a* and is moved in a vertical direction by a driver 3236*d*. The space formed by the cover 323*c* and the heating plate 323*a* according to the movement of the cover 323*c*** is provided as a heating space for heating the substrate W.

The transfer plate 324 is provided in a substantially disk shape, and has a diameter corresponding to that of the substrate W. A notch **324*b* is formed at an edge of the transfer plate 324. The notch 324*b* may have a shape corresponding to a protrusion 3543 formed on the hand 354** of the transfer robot 352 described above. In addition, the notches 324*b* are provided in a number corresponding to the number of protrusions 3543 formed on the hand 354, and are formed at positions corresponding to the protrusions 3543. When the upper and lower positions of the hand 354 and the transfer plate 324 are changed in the position where the hand 354 and the transfer plate 324 are aligned in the vertical direction, the substrate W is transferred between the hand 354 and the transfer plate 324. The transport plate 324 is mounted on a guide rail 324*d* and may be moved between a first area 3212 and a second area 3214 along the guide rail 324*d* by a driver 324*c*. A plurality of slit-shaped guide grooves 324*a* is provided in the transfer plate 324. The guide groove 324*a* extends from the end of the transfer plate 324 to the inside of the transfer plate 324. The longitudinal direction of the guide grooves 324*a* is provided along the second direction 14, and the guide grooves 324*a* are spaced apart from each other along the first direction 12. The guide groove 324*a* prevents the transfer plate 324 and the lift pins 323*e* from interfering with each other when the substrate W is transferred between the transfer plate 324 and the heating unit 323.

The substrate W is cooled in the state where the transfer plate 324 on which the substrate W is placed is in contact with the cooling plate 322*a*. The transfer plate 324 is made of a material having high thermal conductivity so that heat transfer is well performed between the cooling plate 322*a* and the substrate W. According to the example, the transfer plate 324 may be made of a metal material.

The heating units 323 provided in some of the heat treating chambers 320 may supply a gas while heating the substrate W to improve the adhesion rate of the photoresist to the substrate. According to the example, the gas may be hexamethyldisilane (HMDS) gas.

Referring back to FIGS. 1 to 3, a plurality of liquid processing chambers 360 is provided. Some of the liquid processing chambers 360 may be provided to be stacked on each other. The liquid processing chambers 360 are disposed at one side of the transfer chamber 350. The liquid processing chambers 360 are arranged side by side along the first direction 12. Some of the liquid processing chambers 360 are provided at positions adjacent to the index module 100. Hereinafter, the liquid processing chambers 360 located to be adjacent to the index module 100 are referred to as front liquid processing chambers 362. Another some of the liquid processing chambers 360 are provided at positions adjacent to the interface module 500. Hereinafter, the liquid processing chambers 360 located to be adjacent to the interface module 500 are referred to as rear liquid processing chambers 364.

The front liquid processing chamber 362 applies a first liquid onto the substrate W, and the rear liquid processing chamber 284 applies a second liquid onto the substrate W. The first liquid and the second liquid may be different types of liquid. According to the exemplary embodiment, the first liquid is an antireflection film, and the second liquid is a photoresist. The photoresist may be applied onto the substrate W coated with the antireflection film. Optionally, the first liquid may be a photoresist, and the second liquid may be an antireflection film. In this case, the antireflection film may be applied onto the substrate W coated with the photoresist. Optionally, the first liquid and the second liquid are the same type of liquid, and both the first liquid and the second liquid may be the photoresist.

The developing block 300*b* has the same structure as the coating block 300*a*, and the liquid processing chamber provided in the developing block 300*b* supplies a developer onto the substrate.

The interface module 500 connects the processing module 300 to an external exposing device 700. The interface module 500 includes an interface frame 510, an additional process chamber 520, an interface buffer 530, and an interface robot 550.

A fan filter unit for forming a descending airflow therein may be provided at an upper end of the interface frame 510. The additional process chamber 520, the interface buffer 530, and the interface robot 550 are disposed inside the interface frame 510. The additional process chamber 340 may perform a predetermined additional process before the substrate W, which has been completely treated in the coating block 300*a*, is loaded into the exposing device 700. Optionally, the additional process chamber 520 may perform a predetermined additional process before the substrate W, which has been completely processed in the exposing device 700, is loaded into the developing block 300*b*. According to one example, the additional process may be an edge exposure process of exposing an edge region of the substrate W, a top surface cleaning process of cleaning the upper surface of the substrate W, or a lower surface cleaning process of cleaning the lower surface of the substrate W. A plurality of additional process chambers 520 is provided, and may be provided to be stacked on each other. All of the additional process chambers 520 may be provided to perform the same process. Optionally, a part of the additional process chambers 520 may be provided to perform different processes.

The interface buffer 530 provides a space in which the substrate W transferred between the coating block 300*a*, the additional process chamber 520, the exposing device 700, and the developing block 300*b* temporarily stays during the transfer. A plurality of interface buffers 530 may be provided, and the plurality of interface buffers 530 may be provided to be stacked on each other.

According to the example, the additional process chamber 520 may be disposed on one side of the transfer chamber 350 based on an extended line in the longitudinal direction and the interface buffer 530 may be disposed on the other side thereof.

The interface robot 550 transfers the substrate W between the applying block 300*a*, the additional process chamber 520, the exposing device 700, and the developing block 300*b*. The interface robot 550 may have a transfer hand that transfers the substrate W. The interface robot 550 may be provided as one or a plurality of robots. According to the example, the interface robot 550 has a first robot 552 and a second robot 554. The first robot 552 may be provided to transfer the substrate W between the coating block 300*a*, the additional process chamber 520, and the interface buffer 530, and the second robot 554 may be provided to transfer the substrate W between the interface buffer 530 and the exposing device 700, and the second robot 554 may be provided to transfer the substrate W between the interface buffer 530 and the developing block 300*b*.

The first robot 552 and the second robot 554 each include a transfer hand on which the substrate W is placed, and the hand may be provided to be movable forward and backward, rotatable about an axis parallel to the third direction 16, and movable along the third direction 16.

Hereinafter, the structure of the liquid processing chamber will be described in detail. Hereinafter, the liquid processing chamber provided in the coating block will be described as an example. In addition, the liquid processing chamber will be described based on the case of a chamber for applying the photoresist onto the substrate as an example. However, the liquid processing chamber may be a chamber in which a film, such as a protective film or an antireflection film, is formed on the substrate W. In addition, the liquid processing chamber may be a chamber for developing the substrate W by supplying a developer to the substrate W.

Figure 7:
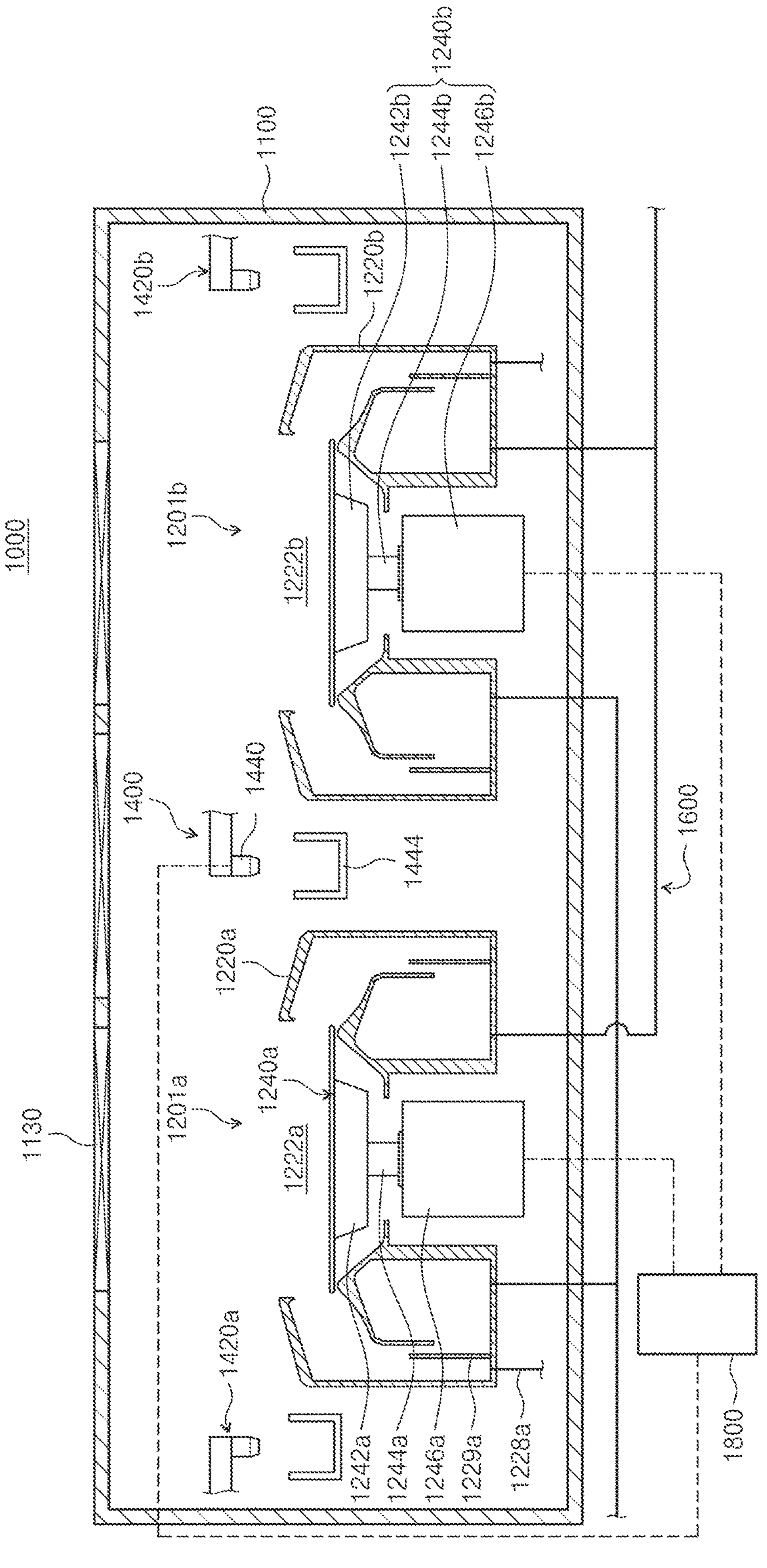
FIG. 7 is a cross-sectional view illustrating an exemplary embodiment of a liquid processing chamber for liquid-processing a substrate W by supplying a processing liquid to a rotating substrate W.
Figure 8:
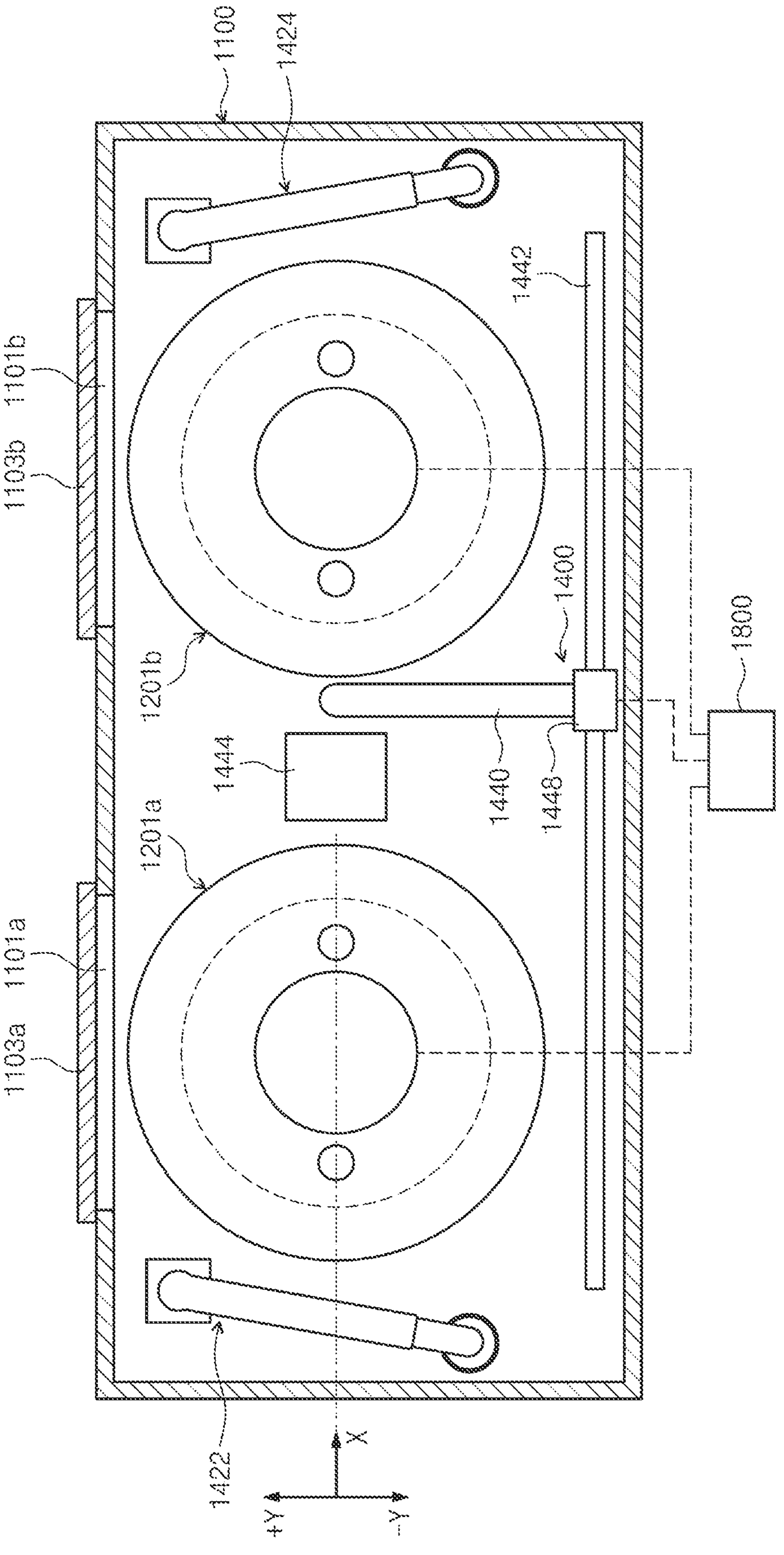
FIG. 8 is a top plan view of the liquid processing chamber of FIG. 7.

FIG. 7 is a cross-sectional view illustrating an exemplary embodiment of the liquid processing chamber for liquid-processing the substrate W by supplying a processing liquid to a rotating substrate W, and FIG. 8 is a top plan view of the liquid processing chamber of FIG. 7.

Referring to FIGS. 7 and 8, the liquid processing chamber 1000 includes a housing 1100, a first processing unit 1201*a*, a second processing unit 1201*b*, a liquid supply unit 1400, an exhaust unit 1600, and a controller 1800.

The housing 1100 is provided in a rectangular cylindrical shape having an inner space. Openings 1101*a* and 1101*b* are formed at one side of the housing 1100. The openings 1101*a* and 1101*b* function as passages through which the substrate W is loaded in and out. Doors 1103*a* and 1103*b* are installed in the openings 1101*a* and 1101*b*, and the doors 1103*a* and 1103*b* open and close the openings 1101*a* and 1101*b*.

A fan filter unit 1130 is disposed on the upper wall of the housing 1100 to supply a descending airflow into the inner space. The fan filter unit 1130 includes a fan for introducing external air into the inner space and a filter for filtering external air.

The first processing unit 1201*a* and the second processing unit 1201*b* are provided in the inner space of the housing 1100. The first processing unit 1201*a* and the second processing unit 1201*b* are arranged along one direction. Hereinafter, a direction in which the first processing unit 1201*a* and the second processing unit 1201*b* are arranged is referred to as a unit arrangement direction, and is illustrated in the X-axis direction in FIG. 11.

The first processing unit 1201*a* has a first processing container 1220*a* and a first support unit 1240*a*.

The first processing container 1220*a* has a first inner space 1222*a*. The first inner space 1222*a* is provided with an open top.

The first support unit 1240*a* supports the substrate W in the first inner space 1222*a* of the first processing container 1220*a*. The first support unit 1240*a* includes a first support plate 1242*a*, a first driving shaft 1244*a*, and a first driver 1246*a*. The first supporting plate 1242*a* has a circular top surface. The first support plate 1242*a* has a smaller diameter than that of the substrate W. The first support plate 1242*a* is provided to support the substrate W by vacuum pressure. Optionally, the first support plate 1242*a* may have a mechanical clamping structure for supporting the substrate W. A first driving shaft 1244*a* is coupled to the center of the bottom surface of the first support plate 1242*a*, and a first driver 1246*a* for providing rotational force to the first driving shaft 1244*a* is provided to the first driving shaft 1244*a*. The first driver 1246*a* may be a motor.

The second processing unit 1201*b* includes a second processing container 1220*b* and a second support unit 1240*b*, and the second support unit 1240*b* includes a second support plate 1242*b*, a second driving shaft 1244*b*, and a second driver 1246*b*. The second processing container 1220*b* and the second supporting unit 1240*b* have substantially the same structure as the first processing container 1220*a* and the first supporting unit 1240*a*.

The liquid supply unit 1400 supplies the liquid onto the substrate W. The liquid supply unit 1400 includes a first nozzle 1420*a*, a second nozzle 1420*b*, and a processing liquid nozzle 1440. The first nozzle 1420*a* supplies a liquid to the substrate W provided to the first support unit 1240*a*, and the second nozzle 1420*b* supplies a liquid to the substrate W provided to the second support unit 1240*b*. The first nozzle 1420*a* and the second nozzle 1420*b* may be provided to supply the same type of liquid. According to the example, the first nozzle 1420*a* and the second nozzle 1420*b* may supply a rinse liquid for cleaning the substrate W. For example, the rinse liquid may be water. According to another example, the first nozzle 1420*a* and the second nozzle 1420*b* may supply a removal liquid for removing the photoresist from the edge region of the substrate W. For example, the removal liquid may be a thinner. Each of the first nozzle 1420*a* and the second nozzle 1420*b* may be rotated between a process position and a standby position about a rotation axis thereof. The process position is a position at which the liquid is discharged onto the substrate W, and the standby position is a position at which the first nozzle 1420*a* and the second nozzle 1420*b* stand by without discharging the liquid onto the substrate W.

The processing liquid nozzle 1440 supplies the processing liquid to the substrate W provided to the first support unit 1240*a* and the substrate W provided to the second support unit 1240*b*. The treatment solution may be a photoresist. The nozzle driver 1448 drives the processing liquid nozzle 1440 so that the processing liquid nozzle 1440 moves between a first process position, the standby position, and a second process position along a guide 1442. The first process position is a position for supplying the processing liquid to the substrate W supported by the first support unit 1240*a*, and the second process position is a position for supplying the processing liquid to the substrate W supported by the second support unit 1240*b*. The standby position is a position in which the nozzle waits the standby port 1444 located between the first processing unit 1201*a* and the second processing unit 1201*b* when the photoresist is not discharged from the processing liquid nozzle 1440.

A gas-liquid separation plate 1229*a* may be provided in the inner space 1201*a* of the first processing container 1220*a*. The gas-liquid separation plate 1229*a* may be provided to extend upwardly from the bottom wall of the first processing container 1220*a*. The gas-liquid separation plate 1229*a* may be provided in a ring shape.

According to the example, the outside of the gas-liquid separation plate 1229*a* may be provided as a discharging space for discharging the liquid, and the inside of the gas-liquid separation plate 1229*a* may be provided as an exhaust space for exhausting the atmosphere. A discharge pipe 1228*a* for discharging the processing liquid is connected to the bottom wall of the first processing container 1220*a*. The discharge pipe 1228*a* discharges the processing liquid introduced between the sidewall of the first processing container 1220*a* and the gas-liquid separation plate 1229*a* to the outside of the first processing container 1220*a*. The airflow flowing into the space between the sidewall of the first processing container 1220*a* and the gas-liquid separation plate 1229*a* is introduced into the gas-liquid separation plate 1229*a*. In this process, the processing liquid contained in the airflow is discharged from the discharging space to the outside of the first processing container 1220*a* through the discharge pipe 1228*a*, and the airflow is introduced into the exhaust space of the first processing container 1220*a*.

Although not illustrated, a lift driver for adjusting the relative height of the first support plate 1242*a* and the first processing container 1220*a* may be provided.

Figure 9:
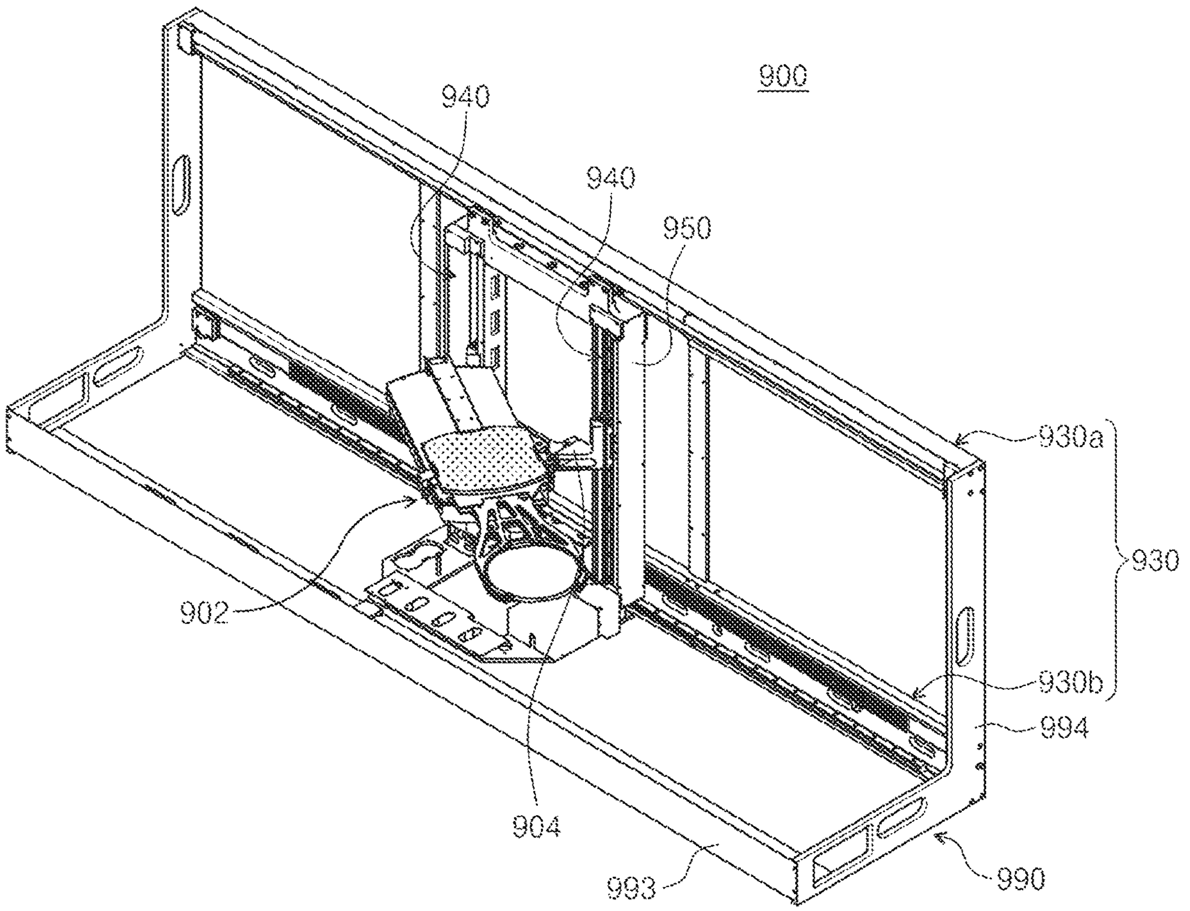
FIG. 9 is a perspective view illustrating an example of the transfer robot of FIG. 3.

FIG. 9 is a perspective view illustrating an example of the transfer robot of FIG. 3.

Hereinafter, the present invention will be described based on the case where a robot 900 of FIG. 9 is the transfer robot of FIG. 3. However, unlike this, the transfer robot may be an index robot, and may optionally be another robot provided in the substrate treating apparatus 10.

Referring to FIG. 9, the transfer robot 900 may include a robot main body 902, a horizontal driving unit 930, and a vertical driving unit 940.

The robot main body 902 may include a hand 910 capable of moving forward and backward (X direction) and rotating (0 direction) while supporting the substrate, and a hand driving unit 920 including a base supporting the hand 910.

The hand driving unit 920 horizontally moves the hands 910, and the hands 910 are individually driven by the hand driving unit 920. The hand driving unit 920 includes a connecting arm 912 connected to an internal driving unit (not illustrated), and the hand 910 is installed at an end of the connecting arm 912. In the present exemplary embodiment, the transfer robot 900 includes two hands 910, but the number of hands 910 may increase according to the process efficiency of the substrate treating apparatus 10. A rotating unit (not illustrated) is installed under the hand driving unit 920. The rotating unit is coupled to the hand driving unit 920 and rotates to rotate the hand driving unit 920. Accordingly, the hands 910 rotate together.

The horizontal driving unit 930 and the vertical driving unit 940 are mounted on one body frame 990.

The body frame 990 may be provided in a form in which several frames are coupled to each other. The body frame 990 may include an upper horizontal driving unit **930*a* and a lower horizontal driving unit 930*b* for guiding the robot main body in the Y direction, a vertical auxiliary frame 992 erected in the vertical direction between the upper and lower horizontal driving units 930*a* and 930*b*, a horizontal auxiliary frame 993 extending in parallel to the lower horizontal driving unit 930*b* to form the body frame 990, an auxiliary frame 994 for coupling the upper and lower horizontal driving units 930*a* and 930*b* and the ends of the horizontal auxiliary frame 993 to each other to form a side shape of the body frame 990**.

In this way, since the body frame 990 is coupled by a plurality of auxiliary frames 992, 993, and 994, the rigidity of the body frame 990 is strengthened, and thus durability is enhanced, such as being able to maintain the shape thereof completely even when used for a long time.

As described above, the horizontal driving units **930*a* and 930*b* are traveling guides for moving the robot main body 902 in the Y direction, and are coupled to both leading ends of the vertical driving unit 940. Among the horizontal driving units 930*a* and 930*b*, in particular, a horizontal driving unit (not illustrated) including a transfer belt is built in the inner surface of the lower horizontal driving unit 930*b*. Accordingly, the robot main body 902 is horizontally moved along the horizontal driving unit 930*a* and 930*b*** by the driving of the transfer belt.

The vertical driving unit 940 is a type of traveling driving unit for moving the robot main body 902 in the Z direction, and is coupled to the horizontal driving units **930*b* and 930*a*. Accordingly, the robot main body 902 may be guided by the horizontal driving units 930*b* and 930*a* to move in the Y direction, and at the same time be guided by the vertical driving unit 940 to move in the Z direction. That is, the robot body 902** may be moved in an oblique direction corresponding to the sum of the Y direction and the Z direction.

On the other hand, the vertical driving unit 940 is formed of a plurality of frames, for example, two vertical frames, which are spaced apart from each other, so that the robot main body 902 may freely enter and exit the space between the two frames.

A vertical driving unit (hereinafter referred to as a vertical driving unit) including a transfer belt is built in the vertical frame 950 of the vertical driving unit 940.

Figure 10:
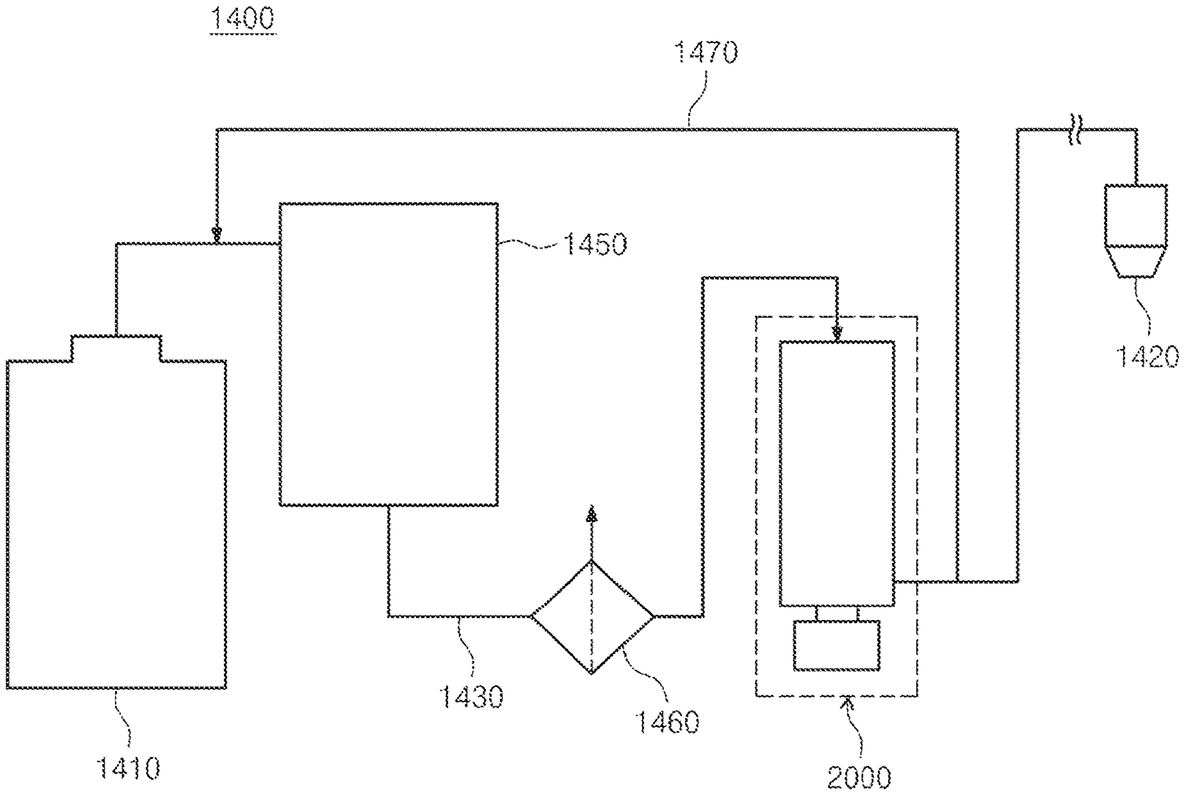
FIG. 10 is a configuration diagram illustrating a liquid supply unit.

FIG. 10 is a configuration diagram illustrating the liquid supply unit.

Referring to FIG. 10, the liquid supply unit 1400 includes a nozzle 1420, a liquid receiving member 1410, a liquid supply line 1430, a trap tank 1450, a pump 2000, a filter 1460, and a purge line 1470. Here, the nozzle may include a first nozzle **1420*a*, a second nozzle 1420*b*, and a processing liquid nozzle 1440 illustrated in FIG. 7**.

The liquid supply line 1430 connects the nozzle 1420 and the liquid receiving member 1410. In the liquid supply line 1430, a trap tank 1450, a pump 2000, and a filter 1460 are installed between the nozzle 1420 and the liquid receiving member 1410. The liquid receiving member 1410 has a receiving space in which the processing liquid is accommodated. The liquid receiving member 1410 may be a bottle in which the processing liquid is accommodated. The processing liquid may be a photoresist containing fluorine (F).

In the trap tank 1450, bubbles of the processing liquid flowing through the liquid supply line 1430 may be removed. The trap tank 1450 is positioned between the nozzle 1420 and the liquid receiving member 1410 in the liquid supply line 1430.

The pump 2000 pressurizes the liquid supply line 1430 so that the processing liquid flowing through the liquid supply line 1430 is supplied in a direction toward the nozzle 1420. The pump 2000 is located downstream the trap tank 1450 in the liquid supply line 1430. According to the example, the pump 2000 may discharge the processing liquid in a manner of discharging the processing liquid in the tube by applying torsion to the tube to induce a change in the volume of the tube.

The filter 1500 filters impurities in the processing liquid flowing through the liquid supply line 1200. The filter 1500 is positioned between the trap tank 1300 and the pump 2000 in the liquid supply line 1200. The filter 1500 may be located closer to the pump 2000 than the trap tank 1300 in the liquid supply line 1200. In the process of passing the processing liquid through the filter 1500, impurities are filtered.

The purge line 1470 is connected to the liquid supply line 1200 so that the processing liquid that has passed through the pump 2000 is returned to the trap tank 1300.

Figure 20:
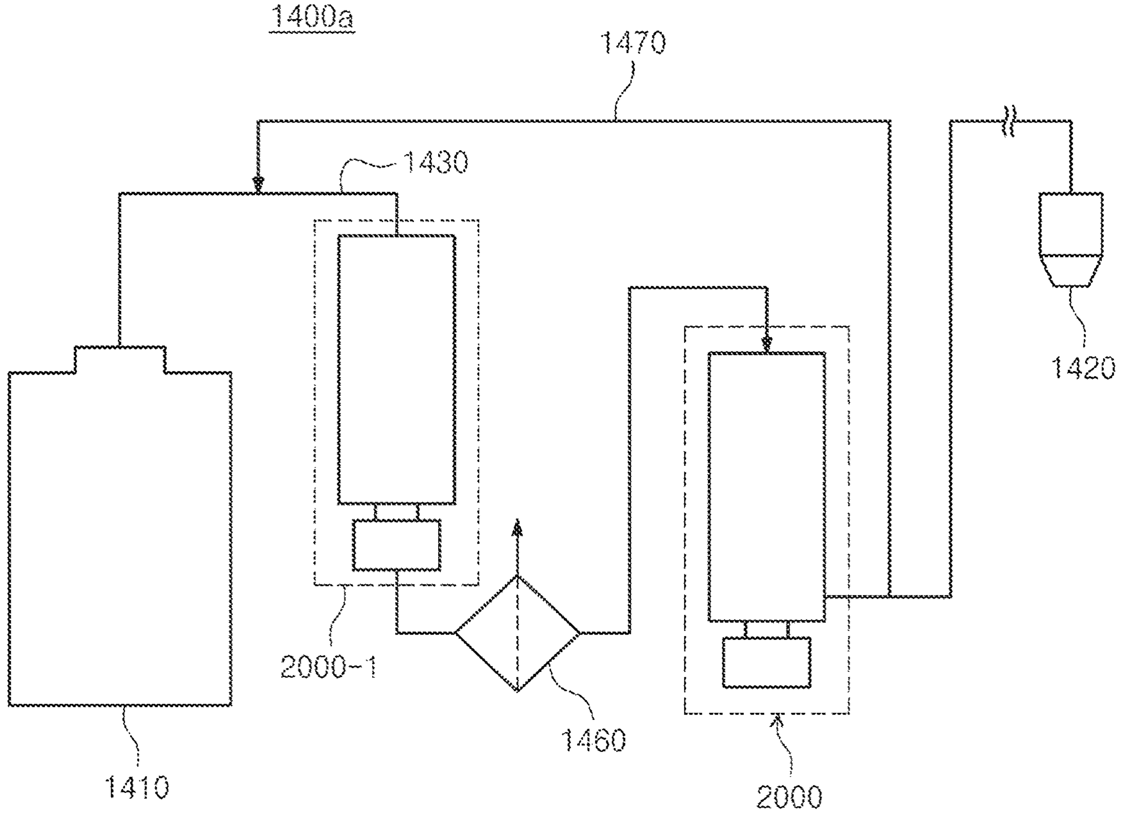
FIG. 20 is a configuration diagram illustrating a modified example of the liquid supply unit.

In the meantime, FIG. 20 is a configuration diagram illustrating a modified example of the liquid supply unit.

As illustrated in FIG. 20, the liquid supply unit **1400*a* includes a nozzle 1420, a liquid receiving member 1410, a liquid supply line 1430, a pump 2000, a filter 1460, and a purge line 1470, and the constituent elements are provided with configurations and functions substantially similar to those of the liquid supply unit 1400 illustrated in FIG. 10, and the difference is that a pump 2000-1** is additionally installed instead of a trap tank.

Figure 11:
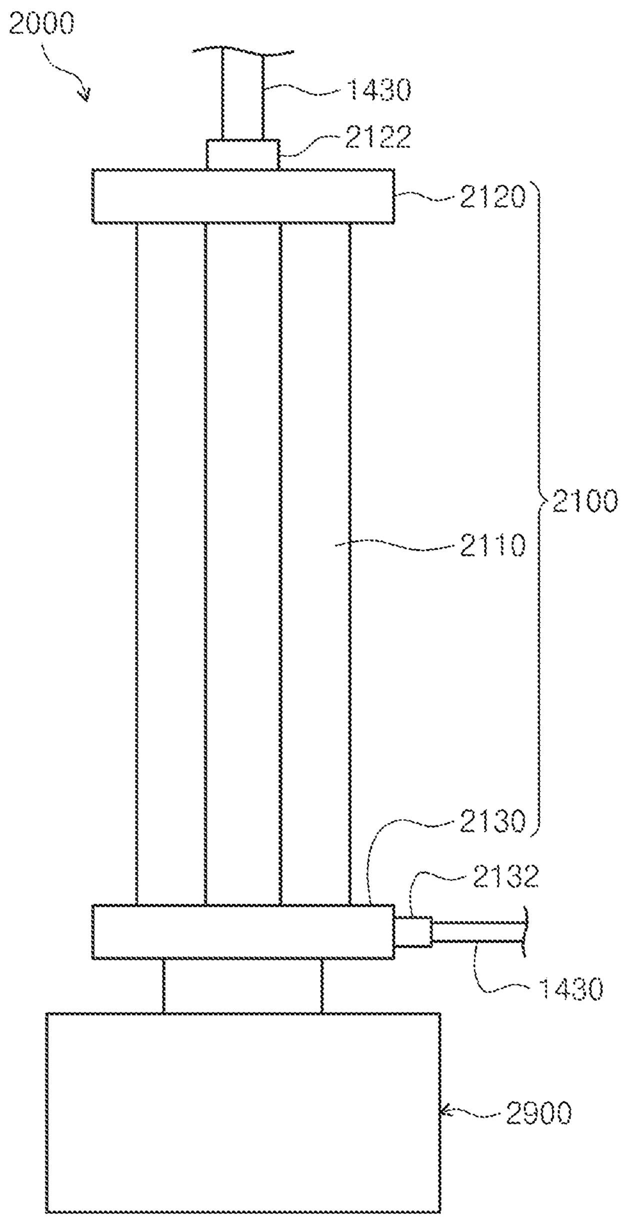
FIG. 11 is a diagram illustrating a pump illustrated in FIG. 10.
Figure 12:
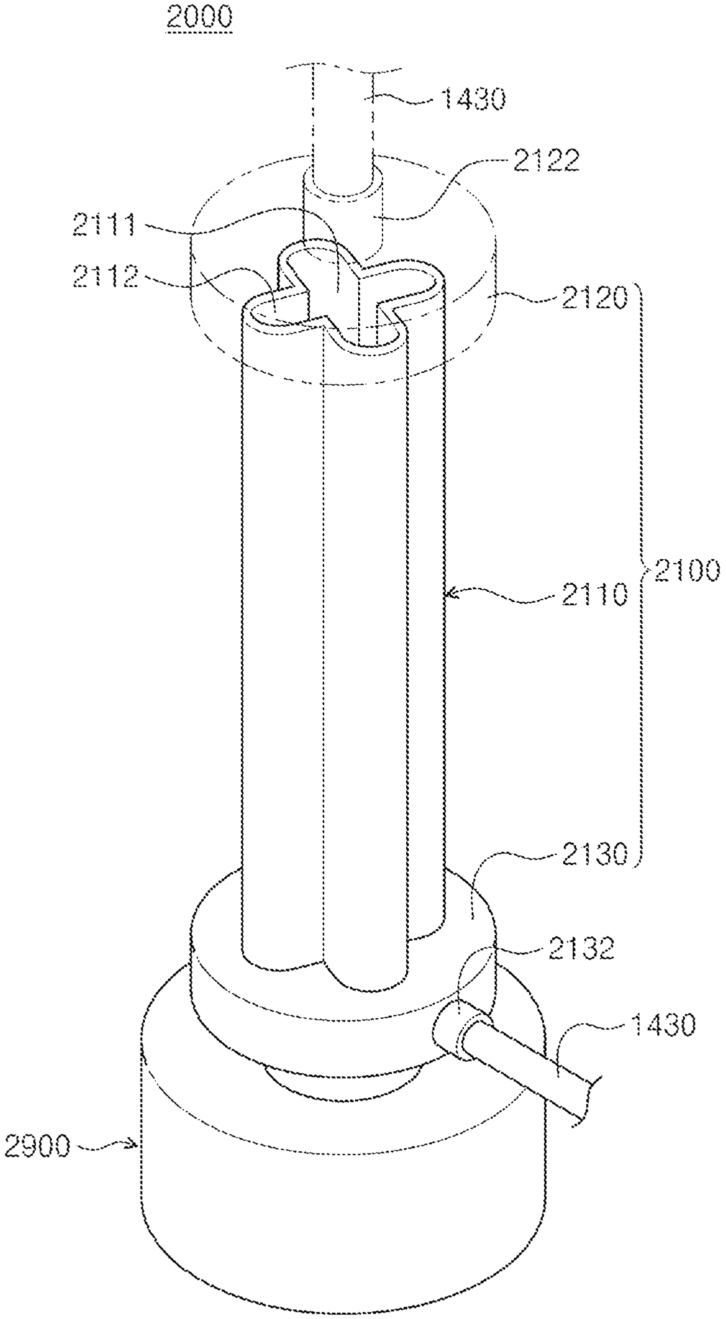
FIG. 12 is a perspective view illustrating the pump illustrated in FIG. 11.
Figure 13:
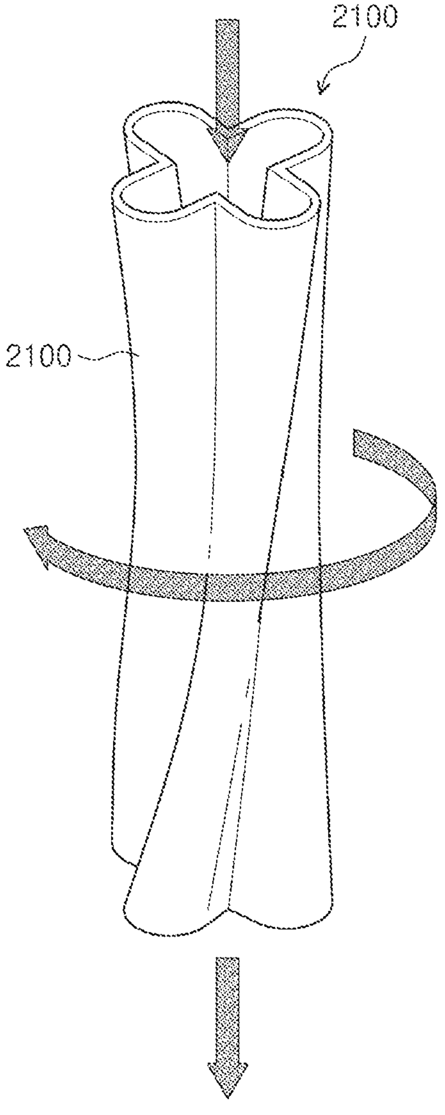
FIG. 13 is a diagram illustrating a state in which a tube is twisted.

FIG. 11 is a diagram illustrating a pump illustrated in FIG. 10, FIG. 12 is a perspective view illustrating the pump illustrated in FIG. 11, and FIG. 13 is a diagram illustrating a state in which a tube is twisted.

The pump 2000 may include a tube 2100 and a driving unit 2900. The pump 2000 is a method of discharging the processing liquid in the tube by giving torsion to the tube to induce a change in volume.

For example, the tube 2100 may include a flexible tube body 2110, a first flange 2120 provided at one end of the tube body 2110, and a second flange 2130 provided at the other end of the tube body 2110.

The tube 2100 performs a twist motion by rotational force applied from the outside. The tube 2100 may be made of a flexible polymer material. Of course, as long as the material of the flexible tube 400 is capable of being twisted when external force is applied, any material may be used. The tube 2100 is preferably manufactured to have elastic restoring force so that the tube can be restored to its initial state when the force applied from the outside is released. Of course, the tube 2100 may be manufactured so as not to have elastic restoring force. This is because the tube 2100 may be restored to its initial state by using force applied from the outside for the twist motion of the tube 2100. However, when the tube 2100 is manufactured to have elastic restoring force so that the tube 2100 can be restored to its initial state by itself, it is possible to reduce the load of externally applied force, so that the tube 2100 is preferably manufactured to have elastic restoring force.

Figure 19:
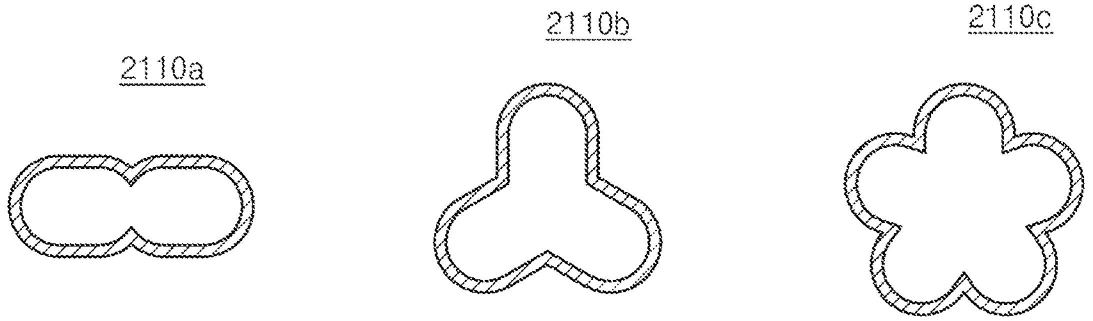
FIG. 19 is diagrams illustrating various cross-sectional shapes of a tube body.

The tube body 2110 has a certain length and has a hollow part (pump chamber) therein. Both ends of the tube body 2110 are opened to allow the processing liquid to enter and exit. When viewing the cross-section of the tube body 2110, the tube body 2110 has a central core space 2111, and four wing spaces 2112 arranged along the periphery around the core space 2111. As such, the cross-section of the tube body 2110 has a four-leaf shape. However, the shape of the tube body is not limited thereto. As illustrated in FIG. 19, the cross-sections of the tube bodies 2100*a*, 2100*b*, and 2100*c* may be provided in various multi-leaf shapes, such as two-leaf, three-leaf, or five-leaf types.

Figure 21:
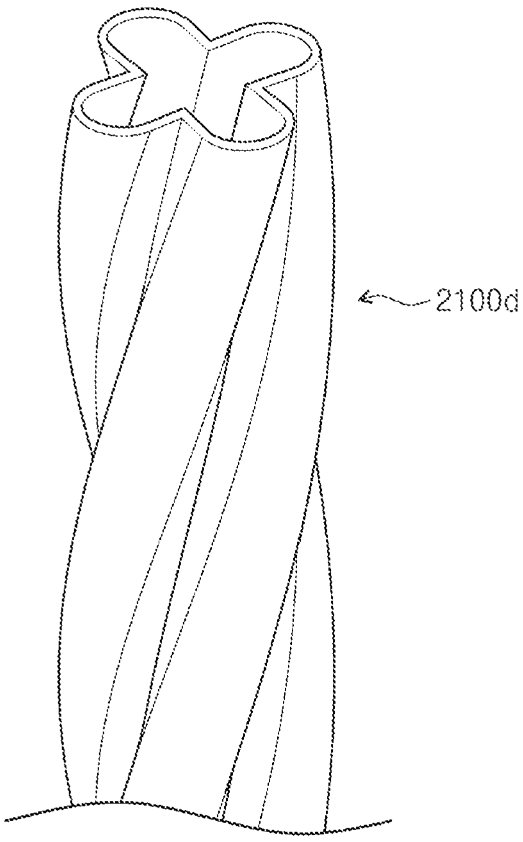
FIG. 21 is a diagram illustrating another example of the tube body.

The tube body is illustrated as having a straight shape in the longitudinal direction, but is not limited thereto. As illustrated in FIG. 21, the tube body 2100*d* may be formed in a spirally twisted structure around a core. As such, since the tube body 2100*d* has a twisted shape from the beginning, a volume change may be increased when the tube body 2100*d* is twisted by the driving unit, and stable twisting may be possible. Here, the twist angle of the tube body may be variously changed.

Figure 22:
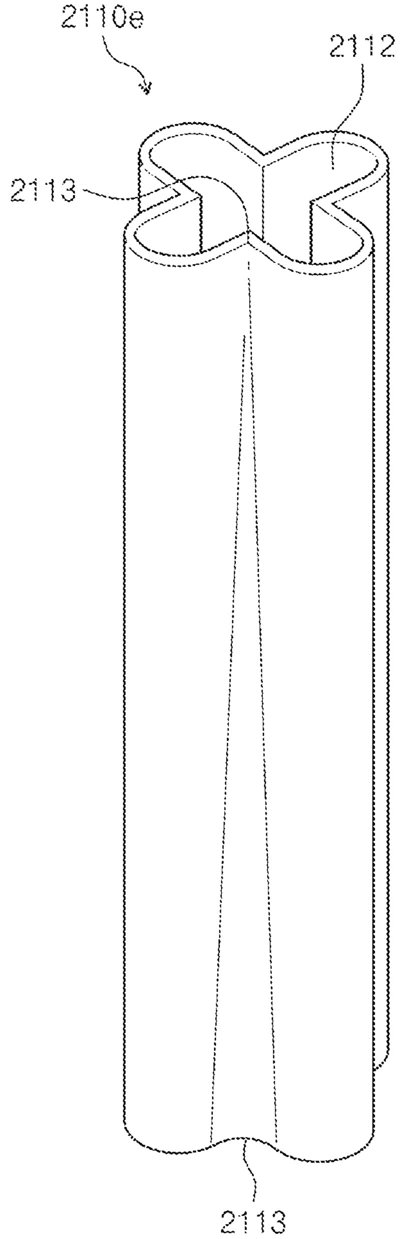
FIG. 22 is a diagram illustrating another example of the tube body.

In addition, the tube body may have a different cross-sectional shape between the upper end and the lower end. That is, as illustrated in FIG. 22, the tube body 2110*e* may be provided in a shape in which the upper end cross-section of the tube body 2110*e* has a large valley 2113 between the wing spaces 2112, and the valley 2113 between the wing spaces 2112 is smoothed toward the lower end of the tube body 2110*e*.

Referring back to FIGS. 11 to 13, the first flange 2120 is coupled to the upper end of the tube body 2110 to seal the upper portion of the tube body 2110. The first flange 2120 may have an inlet 2122 for introducing the processing liquid into the inner space of the tube body 2110.

The second flange 2130 is coupled to the lower end of the tube body 2110 to seal the lower portion of the tube body 2110. The second flange 2130 may be formed with an outlet 2132 through which the processing liquid is discharged from the inner space of the tube body 2110.

The first flange 2120 may be fixed to a separate structure so that rotation is not allowed. The second flange 2130 is connected to the driving unit 2900 so as to be rotated by receiving rotational force.

The driving unit 2900 transmits rotational force to the tube to twist the tube 2100. The driving unit 349 may include a motor. The driving unit 2900 may include a speed reducer for speed control or the like. The driving unit 2900 is connected to the second flange. The rotational force of the driving unit 2900 is provided to the second flange. The driving unit 2900 may transmit the rotational force to the upper cap 200 and be deformed while corresponding to a change in the length of the flexible tube 400 at the same time for the twist motion of the tube 2100.

According to the present invention, since the motor force of the driving unit 2900 is directly transmitted as force that twists the tube, there is no need for an additional device, such as an LM guide or a ball screw, for changing the direction of the force, thereby reducing the size of the pump.

The operation of the pump having the above-described structure is as follows.

In the suction operation of the pump 2100, when the tube body 2110 is restored to its initial state in the state where the inlet 2122 is opened and the outlet 2132 is closed, the processing liquid is introduced into the hollow of the tube body 2110 through the inlet 2122. In the discharge operation of the pump 2100, when the tube body 2110 is twisted in the state where the inlet 2122 is closed and the outlet 2132 is opened, the processing liquid filled in the hollow part of the tube body 2110 is discharged through the outlet 2132 while the volume of the hollow part of the tube body 2110 is reduced.

Figure 14:
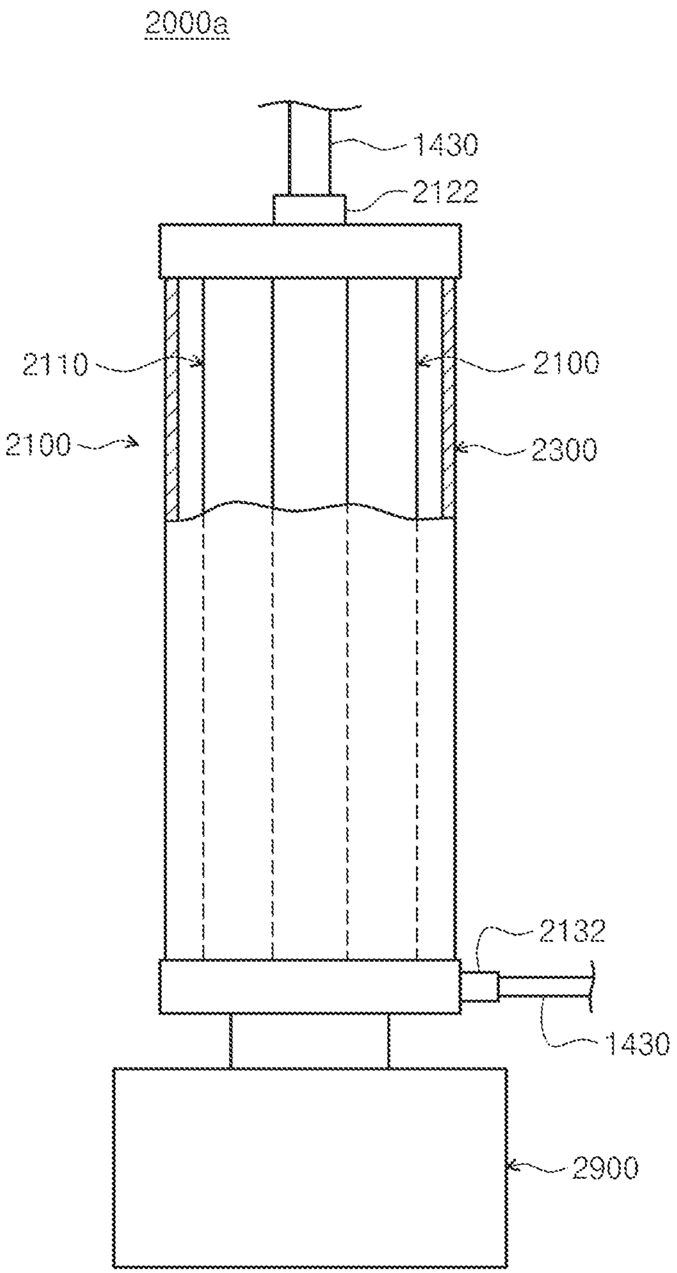
FIG. 14 is a front view illustrating a second exemplary embodiment of a pump.
Figure 15:
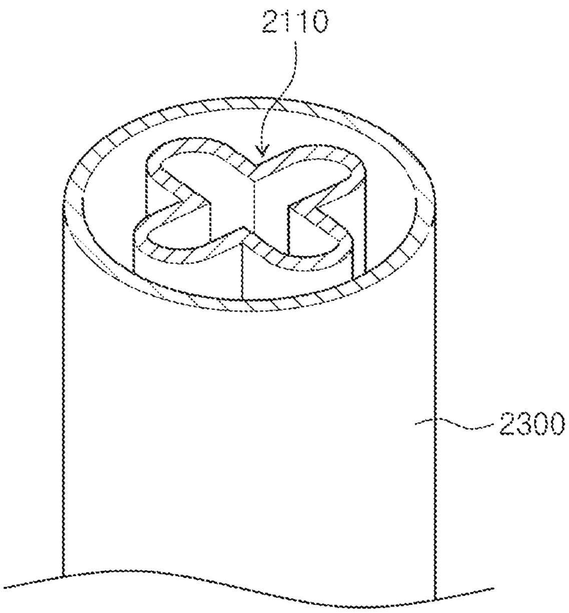
FIG. 15 is a cross-sectional perspective view of a tube.

FIG. 14 is a front view illustrating a second exemplary embodiment of a pump, and FIG. 15 is a cross-sectional perspective view of a tube.

As illustrated in FIGS. 14 and 15, a pump 2000*a* includes a tube 2100 and a driving unit 2900, and the tube 2100 and the driving unit 2900 are provided with substantially similar configurations and functions to the tube 2100 and the driving unit 2900 of the pump 2000 illustrated in FIG. 11, so that hereinafter, the second exemplary embodiment will be mainly described with respect to the differences from the present exemplary embodiment.

In the present exemplary embodiment, the tube 2100*a* is characterized in including a sealing case 2300. The sealing case 2300 may be provided to surround the tube body 2110. The sealing case 2300 may prevent leakage of the chemical liquid from the tube body 2110 to the outside of the pump. For example, the sealing case 2300 may be provided in a cylindrical shape. The sealing case 2300 may be filled with an incompressible fluid therein. The incompressible fluid may be inert gas (for example, nitrogen gas) or a liquid. The incompressible fluid filled in the sealing case 2300 blocks moisture penetration. One end of the sealing case 2300 may be fixed to the first flange 2120, and the other end of the sealing case 2300 may be connected to the second flange 2130, and a bearing (not illustrated) may be provided therebetween. (prevent rotation of the sealing case when the second flange is rotated).

Figure 16:
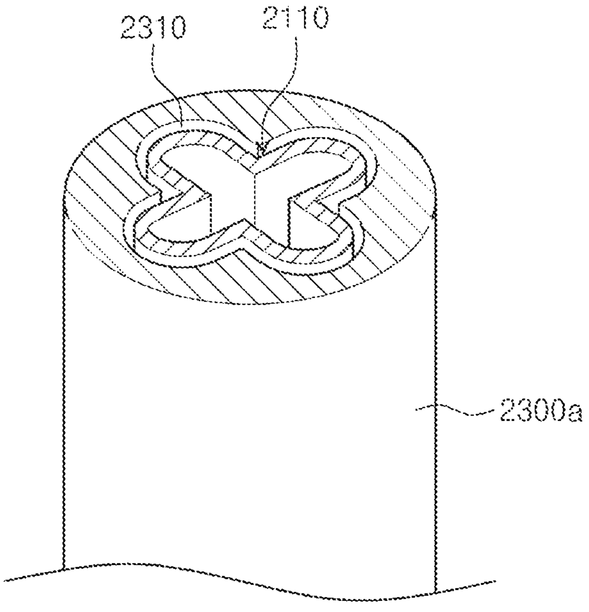
FIGS. 16 and 17 each are a cross-sectional perspective view and a cross-sectional view illustrating a modified example of a sealing case illustrated in FIG. 14.
Figure 17:
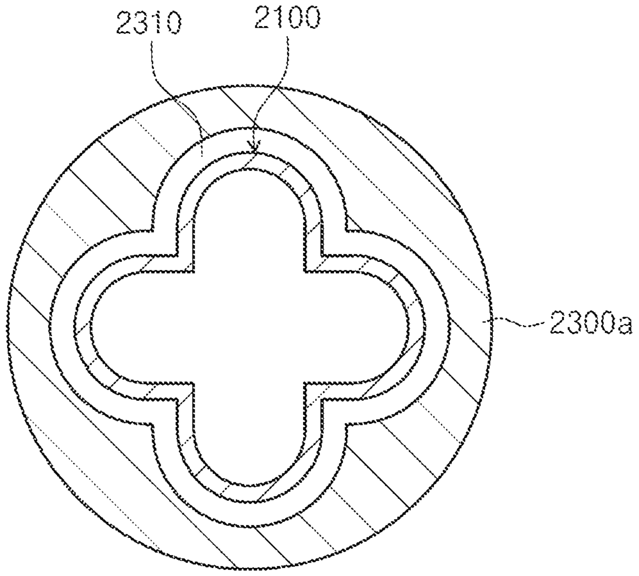

FIGS. 16 and 17 each are a cross-sectional perspective view and a cross-sectional view illustrating a modified example of a sealing case illustrated in FIG. 14.

Referring to FIGS. 16 and 17, the sealing case 2300*a* may be provided with an offset space 2310 to limit the twist of the tube body 2110.

Figure 18:
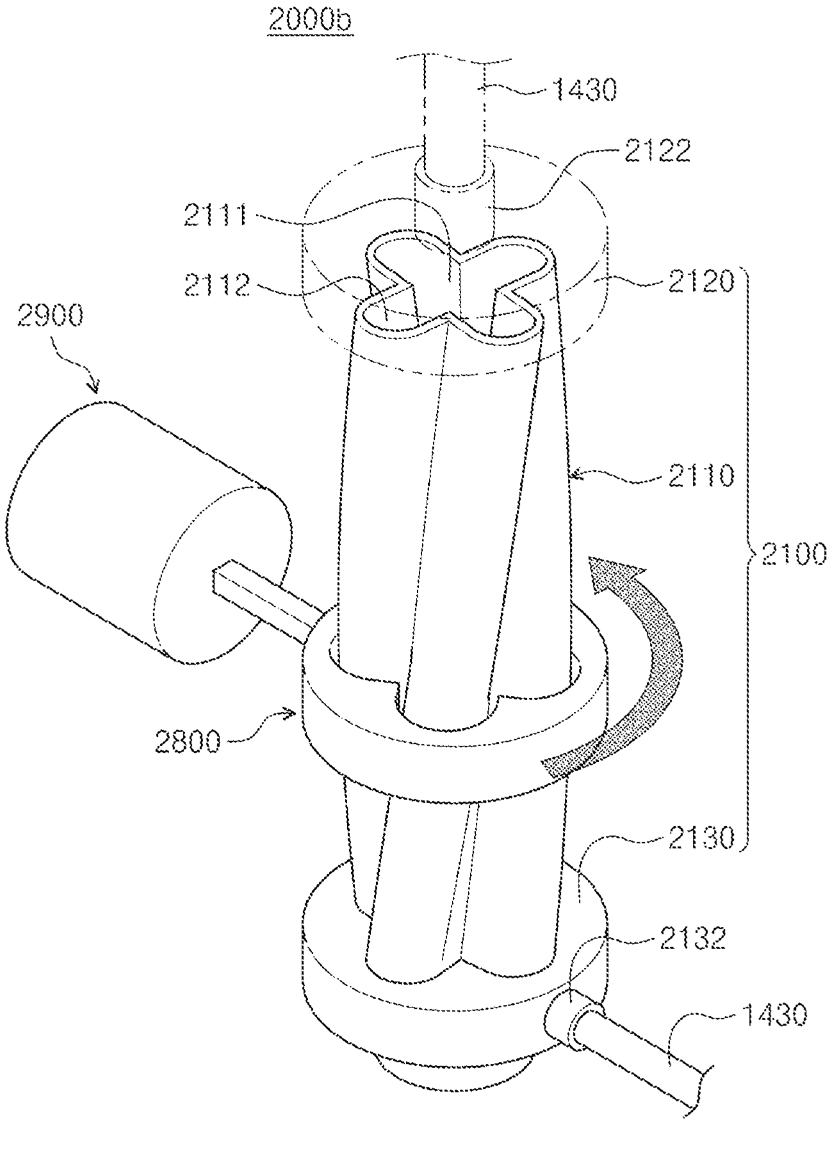
FIG. 18 is a diagram illustrating a third exemplary embodiment of the pump.

FIG. 18 is a diagram illustrating a third exemplary embodiment of a pump.

As illustrated in FIG. 18, a pump 2000*b* includes a tube 2100 and a driving unit 2900 and the tube 2100 and the driving unit 2900 are provided with substantially similar configurations and functions to the tube 2100 and the driving unit 2900 of the pump 2000 illustrated in FIG. 11, so that hereinafter, the third exemplary embodiment will be mainly described with respect to the differences from the present exemplary embodiment.

In the present exemplary embodiment, the pump 200*b* is characterized in including a rotating member 2800. The rotating member 2800 may be installed to be fitted in a tube body 2110. The rotating member 2800 transmits the rotational force of the driving unit 2900 to the tube body 2110. The rotating member 2800 may be installed in the middle of the tube body 2110. The tube 2100 may be twisted from the middle portion by the rotating member 2800. That is, since the twist force is generated from the middle portion of the tube, the volume change of the tube 2100 may be relatively large compared to the scheme in which the torsion is generated from one end of the tube 2100.

The foregoing detailed description illustrates the present invention. In addition, the above description shows and describes the exemplary embodiments of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A torsion pump, comprising:

a tube including a pump chamber communicating with a chemical liquid inlet and a chemical liquid outlet, wherein the tube includes a flexible tube body;

a motor for transmitting rotational force to the tube to twist the tube; and a sealing case provided to surround the tube, wherein the sealing case has an inner circumferential shape corresponding to a cross-section of the flexible tube body, and an offset space is defined between the inner circumferential shape of the sealing case and the cross-section of the flexible tube body such that upon twisting of the flexible tube body, at least a portion of an outer surface of the flexible tube body contacts an inner surface of the sealing case to limit further twisting of the flexible tube body, wherein the flexible tube body has a multi-leaf shape in cross-section, and wherein a first radial distance from a central axis of the flexible tube body to an outermost point of the flexible tube body is greater than a second radial distance from the central axis to an innermost point of the inner circumferential shape of the sealing case.

2. The torsion pump of claim 1, wherein the tube includes:

a first flange provided at one end of the flexible tube body;

a second flange provided at the other end of the tube body, and the second flange is connected to the motor and rotates.

3. The torsion pump of claim 2, wherein the first flange is provided with the chemical liquid inlet, and the second flange is provided with the chemical liquid outlet.

4. The torsion pump of claim 2, wherein the flexible tube body has a four leaf shape in cross section.

5. The torsion pump of claim 2, wherein the flexible tube body has a helically twisted structure around a core.

6. The torsion pump of claim 2, wherein a cross-sectional shape of an upper end of the flexible tube body is different from a cross-sectional shape of a lower end of the flexible tube body.

7. The torsion pump of claim 2, wherein the offset space is provided with a uniform width along a circumferential surface of the tube body.

8. The torsion pump of claim 1, wherein the sealing case is provided in a cylindrical shape.

9. The torsion pump of claim 1, wherein the sealing case is filled with an incompressible fluid therein.

10. The torsion pump of claim 1, further comprising: a rotating member which is installed on the flexible tube body and transmits the rotational force of the motor to the tube.

11. The torsion pump of claim 10, wherein the rotating member is installed in the middle of the flexible tube body.

12. A chemical liquid supplying apparatus, comprising:

a pump for supplying a chemical liquid to a nozzle discharging the chemical liquid to a substrate;

a trap tank in which the chemical liquid to be supplied from the pump to the nozzle is temporarily stored;

a bottle containing the chemical liquid stored in the trap tank;

a filter provided on a path through which the chemical liquid is supplied from the trap tank to the pump, wherein the pump includes:

a tube including a pump chamber communicating with a chemical liquid inlet and a chemical liquid outlet, wherein the tube includes a tube body, wherein the tube body is flexible; and a motor for transmitting rotational force to the tube to twist the tube, a sealing case provided to surround the tube, wherein the sealing case has an inner circumferential shape corresponding to a cross-section of the tube body, and an offset space is defined between the inner circumferential shape of the sealing case and the cross-section of the tube body such that, upon twisting of the tube body, at least a portion of an outer surface of the tube body contacts an inner surface of the sealing case to limit further twisting of the tube body, wherein the tube body has a multi-leaf shape in cross-section, and wherein a first radial distance from a central axis of the tube body to an outermost point of the tube body is greater than a second radial distance from the central axis to an innermost point of the inner circumferential shape of the sealing case.

13. The chemical liquid supplying apparatus of claim 12, wherein the tube includes:

a first flange provided at one end of the tube body and including the chemical liquid inlet; and a second flange provided at the other end of the tube body and including the chemical liquid outlet, and the second flange receives rotational force from the motor.

14. The chemical liquid supplying apparatus of claim 13, wherein the tube body has a four leaf shape in cross section.

15. The chemical liquid supplying apparatus of claim 13, wherein the tube body has a helically twisted structure around a core.

16. The chemical liquid supplying apparatus of claim 13, wherein a cross-sectional shape of an upper end of the tube body is different from a cross-sectional shape of a lower end of the tube body.

17. The chemical liquid supplying apparatus of claim 13, wherein the offset space is provided with a uniform width along a circumferential surface of the tube body.

18. The chemical liquid supplying apparatus of claim 12, wherein the sealing case is filled with an incompressible fluid therein.

19. The chemical liquid supplying apparatus of claim 12, further comprising:

a rotating member which is installed on the tube body and transmits the rotational force of the motor to the tube, wherein the rotating member is installed in the middle of the tube body.

20. A torsion pump, comprising:

a flexible tube body extending along a longitudinal axis and including a pump chamber therein;

a first flange provided at a first end of the flexible tube body;

a second flange provided at a second end of the flexible tube body;

a driving unit configured to transmit rotational force to the flexible tube body to twist the flexible tube body about the longitudinal axis; and a sealing case surrounding the flexible tube body, wherein:

the flexible tube body has a multi-leaf outer circumferential shape in cross-section about a central axis, the multi-leaf outer circumferential shape including a plurality of radially outwardly extending portions and radially inwardly recessed portions;

the sealing case has an inner circumferential shape that corresponds to, and radially surrounds, the multi-leaf outer circumferential shape of the flexible tube body;

an offset space is defined between the outer circumferential shape of the flexible tube body and the inner circumferential shape of the sealing case;

the offset space is configured such that, upon twisting of the flexible tube body, at least a portion of the outer circumferential shape of the flexible tube body contacts the inner circumferential shape of the sealing case to limit twisting of the flexible tube body; and a first radial distance from the central axis of the flexible tube body to an outermost point of the flexible tube body is greater than a second radial distance from the central axis to an innermost point of the inner circumferential shape of the sealing case.

* * * * *